(12) United States Patent
Dombrowski et al.

(10) Patent No.: US 9,048,842 B2
(45) Date of Patent: Jun. 2, 2015

(54) SENSOR ELEMENT DEVICE FOR A CAPACITIVE PROXIMITY SWITCH

(75) Inventors: Holger Dombrowski, Oehringen (DE); Thorsten Fix, Pforzheim (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 1113 days.

(21) Appl. No.: 12/844,424

(22) Filed: Jul. 27, 2010

(65) Prior Publication Data
US 2011/0025643 A1 Feb. 3, 2011

(30) Foreign Application Priority Data
Jul. 28, 2009 (DE) .......................... 10 2009 036 162

(51) Int. Cl.
H03K 17/96 (2006.01)

(52) U.S. Cl.
CPC ...... *H03K 17/962* (2013.01); *H03K 2017/9602* (2013.01); *H03K 2217/96076* (2013.01); *H03K 2217/96079* (2013.01)

(58) Field of Classification Search
CPC ................... H03K 17/962; H03K 2017/9602; H03K 2217/960755; H03K 2217/96076; H03K 2217/96079; G06F 3/01; G06F 3/011; G06F 3/0412; G06F 3/044
USPC ............ 345/170, 173–176; 178/18.01–18.11, 178/20.01; 200/310–311, 313, 317, 600; 341/33; 362/23.01, 23.07, 23.19
See application file for complete search history.

(56) References Cited

U.S. PATENT DOCUMENTS

| | | | |
|---|---|---|---|
| 4,380,040 A * | 4/1983 | Posset | 200/600 |
| 5,917,165 A | 6/1999 | Platt et al. | |
| 6,403,904 B1 | 6/2002 | Schilling | |
| 7,295,190 B2 * | 11/2007 | Philipp | 345/173 |
| 7,445,350 B2 * | 11/2008 | Konet et al. | 362/84 |
| 7,511,242 B2 | 3/2009 | Winkler | |
| 7,834,287 B2 * | 11/2010 | Heiman et al. | 200/600 |

(Continued)

FOREIGN PATENT DOCUMENTS

| | | |
|---|---|---|
| DE | 103 52 681 A1 | 6/2005 |
| DE | 20 2006 003 115 U1 | 5/2006 |

(Continued)

OTHER PUBLICATIONS

German Office Action for German Application No. 10 2009 036 162.6 dated Apr. 21, 2010.

(Continued)

*Primary Examiner* — Temesgh Ghebretinsae
*Assistant Examiner* — Keith Crawley
(74) *Attorney, Agent, or Firm* — Alston & Bird LLP

(57) ABSTRACT

A sensor element device for a capacitive proximity switch of an operating device, where the sensor element device has an upper side for contacting the underside of an operating panel of the operating device and a block-like illuminated display with a lighting direction towards the underside of the operating panel. The sensor element device is electrically conductive on its side or an upper side facing the operating panel, thereby forming a sensor element. The illuminated display is mounted on a component carrier by a voluminous, spatial-shape-variable, elastic and electrically conductive material, where this material layer provides the required variable distance and electrical connection from the upper side to the underside as electrical contacts.

15 Claims, 1 Drawing Sheet

(56) References Cited

U.S. PATENT DOCUMENTS

| | | |
|---|---|---|
| 2002/0167704 A1 | 11/2002 | Kleinhans et al. |
| 2004/0027341 A1* | 2/2004 | Derocher .................. 345/173 |
| 2006/0131159 A1 | 6/2006 | Kaps et al. |
| 2007/0068789 A1 | 3/2007 | Streifler |
| 2007/0181412 A1* | 8/2007 | Raunig ..................... 200/310 |
| 2008/0113195 A1* | 5/2008 | Boll et al. ................. 428/401 |
| 2008/0169827 A1 | 7/2008 | Dorwarth |
| 2008/0257707 A1* | 10/2008 | Murase et al. ............. 200/600 |
| 2009/0115645 A1* | 5/2009 | Roth .......................... 341/33 |
| 2009/0261088 A1 | 10/2009 | Isoda et al. |
| 2009/0303201 A1 | 12/2009 | Isoda et al. |
| 2010/0096382 A1 | 4/2010 | Sakakibara et al. |
| 2012/0126834 A1 | 5/2012 | Kleinhans |

FOREIGN PATENT DOCUMENTS

| | | |
|---|---|---|
| DE | 10 2006 039 132 A1 | 3/2008 |
| DE | 10 2008 014 443 A1 | 11/2008 |
| DE | 10 2008 052 816 A1 | 4/2010 |
| DE | 10 2009 036 161 A1 | 2/2011 |
| JP | 2008-210800 A | 9/2008 |
| WO | WO 2006/018214 A1 | 2/2006 |
| WO | WO 2008/013220 A1 | 1/2008 |
| WO | WO 2008/037671 A1 | 4/2008 |

OTHER PUBLICATIONS

European Search Report for European Application No. 10 17 0631 dated Nov. 30, 2010.

* cited by examiner

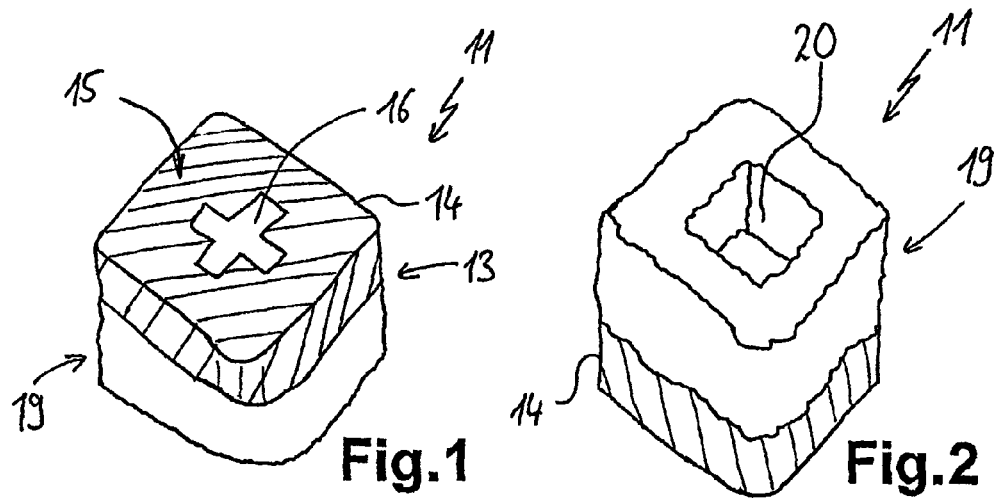
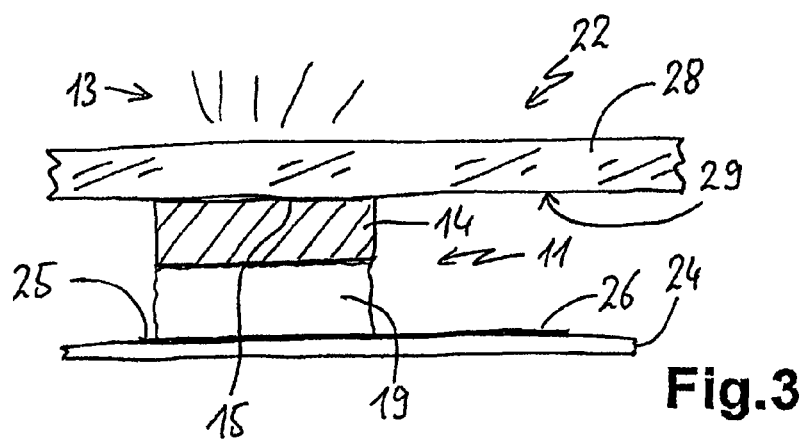
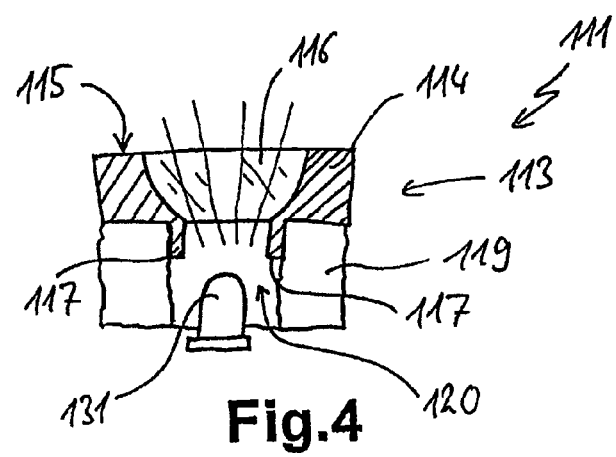

SENSOR ELEMENT DEVICE FOR A CAPACITIVE PROXIMITY SWITCH

CROSS REFERENCE TO RELATED APPLICATIONS

This application claims priority to German Application Number 10 2009 036 162.6, filed on Jul. 28, 2009, the contents of which are incorporated by reference for all that it teaches.

FIELD OF THE INVENTION

The invention relates to a sensor element device for a capacitive proximity switch of an operating device.

BACKGROUND OF THE INVENTION

A sensor element device is known from EP 859 467 A (also published as U.S. Pat. No. 5,917,165), having a voluminous and spatial-shape-variable plastic body in cylindrical form with a recess in the longitudinal direction. On its upper side, a plastic disk having a translucent portion in symbol form, for example as an elongated rectangle, is provided. An LED provided inside the recess in the plastic body therefore has the effect of creating an illuminated symbol display. The upper side of the elastic plastic body as a wide circular ring forms a capacitive sensor element of the capacitive proximity switch device.

It is furthermore known from EP 1 030 536 A1 (also published as U.S. Pat. No. 6,403,904) how to provide a surrounding metal frame with an illuminated display as a seven-segment display. This frame runs supported at the side past the illuminated display and thereby, as it were, enables a capacitive proximity switch to be created with an illuminated display. If a finger is placed on the illuminated display, in particular with an operating panel in between them, the capacitive proximity switch can detect this and trigger a switching function.

SUMMARY

An object underlying the invention is to provide a sensor element device of the aforementioned type for a capacitive proximity switch with illuminated display, eliminating the problems present in the prior art and using, in particular, an advantageous combination of the capacitive proximity switch and the illuminated display.

This object is achieved in one embodiment by a sensor element device having the features as claimed herein. Advantageous and preferred embodiments of the invention form the subject matter of the further claims and are explained in greater detail in the following text. The wording of the claims is made into part of the substance of the description by express reference.

The sensor element device has an upper side for contacting the underside of an operating panel of the operating device. The sensor element device also has an illuminated display with a frame body, in particular a light element with a frame, with a lighting direction towards the underside of the operating panel. In accordance with an embodiment of the invention, the illuminated display is designed as a sensor element device or forms a part of the sensor element device, to which end the sensor element is electrically conductive at least on its side or upper side facing the operating panel, thereby forming a planar sensor element for the capacitive proximity switch. This sensor element is then in contact with the underside of the operating panel, similar to how the surrounding metal frame does this in the aforementioned EP 1 030 536 A1, for example. Furthermore, the illuminated display is mounted on a component carrier by means of a voluminous spatial-shape-variable and/or elastic layer of electrically conductive material. This material layer thus provides as a first function an elastic or flexible pressing of the illuminated display, and hence of the sensor element, against the underside of the operating panel. Furthermore, the illuminated display has an electrically conductive connection of its upper side to its underside, for establishing contact with the material layer. The sensor element is therefore connected via this material layer, as a second function, to an electrical port on the component carrier, which can lead to a control and/or evaluation unit or to a general control unit.

The material layer for the sensor element device thus performs two functions, i.e., first flexibly pressing of the sensor element against the underside of the operating panel to achieve electrically and technically readily controllable and defined conditions, and second forming at least a part of the electrical contacting or electrical connection to the sensor element, preferably the entire electrical connection.

In another embodiment of the invention, the sensor element on the upper side of the illuminated display can be designed at least in a surrounding and frame-like manner, possibly also full-surface. In the case of a sufficiently wide version with a few millimeters of frame width, this is sufficient for a capacitive proximity switch. The sensor element can, in accordance with another embodiment of the invention, advantageously cover the entire surface of the illuminated display or can be formed by the entire surface of the illuminated display. There are several possibilities to do so, which are described below. It must then of course also be ensured that if the illuminated display has to be translucent in the central area or to emit light, the sensor element does not have a negative impact on this light emission.

In an alternative embodiment of the invention, the sensor element can also be designed in a frame-like and surrounding manner with a recess advantageously arranged in the middle. The recess can either be smaller than a display symbol of the illuminated display, particularly in the case of a diffuse light guide material, or advantageously at least as large as a display symbol of the illuminated display. The sensor element can thus be designed opaque without problem and a translucent portion is no longer required.

The sensor element is advantageously in planar contact with the underside of the operating panel for the best possible function as a capacitive proximity switch. In particular, it is in contact by its entire surface, i.e., in the case of a frame-like design by this frame area, alternatively by its entire area.

In another embodiment of the invention, the electrically conductive connection of the sensor element on the upper side of the illuminated display to the underside can be a conductive lacquer, i.e., an electrically conductive lacquer, alternatively an electrically conductive coating. In this case, areas can be provided on the top of the illuminated display, at least in the form of the previously described sensor element, i.e., where the upper side of the illuminated display or the sensor element is in contact with the underside of the operating panel. The conductive lacquer can extend from the rim of the illuminated display to its lower area or to its underside, i.e., to a contact or touch surface with the material layer. In this way electrical contact is established.

In a further embodiment of the invention, a previously described conductive lacquer can be translucent, advantageously substantially transparent. It can then cover substantially the entire surface of the illuminated display, as already described above.

Alternatively, the conductive lacquer can be opaque, for example a silver lacquer. It can then cover, as previously described, a surrounding frame-like area of the upper side of the illuminated display and leave the illuminated area in the center free. An opaque portion at the side of the illuminated display is not disruptive, since no illumination is usually required there anyway. It is possible that illumination at the side can be prevented solely by an opaque conductive lacquer of this type, for example when the material of the entire element is translucent. The application of a conductive lacquer of this type can be achieved for example by dipping, spraying or printing. Removal of the opaque conductive lacquer in the form of the illuminated symbol to be displayed can for example be achieved in line with DE 10 2004 040 998 A1 or in line DE 10 2009 036 161 A1, to which explicit reference is made in this respect. Removal by laser is regarded as particularly advantageous.

Alternatively to the provision of a conductive lacquer, both as the sensor element and as the electrical connection from said sensor element to a material layer, it can be provided that the illuminated display itself can be made at least partially, and advantageously completely, from electrically conductive material. This material can then form both the sensor element on the upper side of the illuminated display and the described electrically conductive connection on the material layer. This can advantageously be made as a surrounding frame section of electrically conductive plastic surrounding a light guide body made of translucent material. This light guide body can, for example, also be already designed in symbol form for the required illuminated display. A light guide body of this type does not need to be electrically conductive, since a sensor element of frame-like design for the capacitive proximity switch is regarded as sufficient and hence the expenditure for the translucent plastic remains lower. It may also be possible to dispense completely with such a light guide body and only to provide a corresponding recess or lead-through as a light passageway. The electrically conductive plastic of the illuminated display thus forms with its upper side the capacitive sensor element and with its underside or lower area the electrical contact with the material layer. The expensive application of a conductive lacquer can thus be dispensed with.

Alternatively to a conductive lacquer on the upper side of the illuminated display as the capacitive sensor element, an alternative electrically conductive coating could be applied, possibly even as a metallic coating or thin metal sheet or thin metal foil. The latter are then advantageously glued on to prevent assembly problems, where an electrically conductive adhesive can also be advantageous for the gluing step. In yet another embodiment of the invention, the illuminated display can comprise an electrically conductive metal part with a recess in symbol form, for example of thick sheet metal as a stamping.

The frame body or the illuminated display as a function unit can be designed block-like. The form and above all the design of the upper side for the sensor element can also be round, oval, triangular or polygonal.

The illuminated display can be, for example, designed as a seven-segment display with a frame body and with corresponding light guide bodies of translucent material or light passageways, advantageously seven in number. A light source or an illuminant is then provided for each light guide body. The material between the light passageways is then advantageously the same as that for the frame body.

In a further embodiment of the invention, the illuminated display is not only simply placed onto the material layer and fastened or positioned where possible by a positive connection, but an electrically conductive bond can also be provided. As a result, the illuminated display and the material layer can be formed with prior gluing as a single component, which can then easily be fitted onto the component carrier. The material layer can also be fastened in similar form on the component carrier with an electrically conductive bond.

The material layer can advantageously comprise electrically conductive, elastic foamed plastic, described for example in the above EP 859 467 A2 (also published as U.S. Pat. No. 5,917,165). The height of the material layer can be a few millimeters, preferably between 1 mm and 5 mm, and in particular it can be between 3 mm and 4 mm, hence assuring a sufficient spring deflection of 1 or 2 mm.

The material layer advantageously has a cutout into which an illuminant for the illuminated display can be arranged. It is particularly advantageous when this is an LED. A cutout like this can be provided in the center so that the material layer can be designed as a surrounding frame. It can be opaque towards the side, so that unwelcome light towards the side and outwards, i.e., not just on the upper side of the illuminated display, can be avoided.

These and further features can be gathered not only from the claims, but also from the description and the drawings, where the individual features, both singly and severally in the form of sub-combinations, can be implemented in various embodiments of the invention and in other fields and can represent advantageous and independently protectable designs for which protection is claimed here. The subdivision of the application into individual sections and subheadings in no way restricts the general validity of the statements made there under.

BRIEF DESCRIPTION OF THE DRAWINGS

Embodiments of the invention are shown schematically in the drawings and described in greater detail in the following. The drawings show in:

FIG. 1 a plan view of a sensor element device in accordance with the invention in an oblique view, having an illuminated display together with a symbol fastened on an elastic material layer, FIG. 2 the sensor element device from FIG. 1 in an oblique view of the underside, FIG. 3 the sensor element device from FIG. 1 in the installed state in an operating device between the component carrier and the operating panel, and FIG. 4 a section through a slightly modified sensor element device similar to FIG. 2.

DETAILED DESCRIPTION

FIG. 1 shows in an oblique plan view a sensor element device 11 having a block-like illuminated display 13 made of plastic. The illuminated display 13 comprises a frame body 14 made of opaque plastic. Instead of plastic, a conductive metal part can also be used. A light guide body 16 in symbol form is injection-moulded into the frame body 14 to create a plus sign. This is easily possible in two-component injection moulding. Alternatively to a light guide body, the entire part can also consist of translucent plastic and an opaque conductive lacquer can be applied to the upper side to create the symbol using the symbol cutout.

As shown by the hatching of the frame body 14, the frame body is covered by an electrically conductive lacquer, in particular on the upper side 15 and on the other sides and the underside. A conductive lacquer like this can be designed either as the previously described silver lacquer and opaque, while leaving free the light guide body 16 or symbol, or translucent, so that the entire upper side 15, including over the light guide body 16, is lacquered and coated by the conductive lacquer.

The illuminated display 13 is fastened on a thick material layer 19 that is very thick or almost block-like and comprises the above material. Its design can also be seen from the view in FIG. 2. The material layer 19 has a central recess 20 passing through it completely. An illuminant or an LED can be arranged therein, as explained in greater detail in the following, and radiating from underneath into the light guide body 16 and thus illuminating its symbol form. A connection of the illuminated display 13 and the material layer 19 can be achieved by an electrically conductive adhesive. This enables both electrical contacting and a mechanical connection of the two parts to form one structural unit.

FIG. 3 shows an operating device 22 where a sensor element device 11 in accordance with FIGS. 1 and 2 is installed. A large contact panel 25 with feed line 26 is provided on a component carrier 24, advantageously a standard PCB. The sensor element device 11 is placed thereon with an underside of the material layer 19 and held mechanically. It is advantageously glued on with conductive adhesive.

The illuminated display 13 and the sensor element device 11 contact with the upper side 15 the underside 29 of the operating panel 28. The upper side 15 shown hatched in FIG. 1 here forms a capacitive sensor element with a large area thus contacting the underside 29, as is usual in the case of a capacitive proximity switch. This sensor element of the upper side 15 is linked via the electrically conductive coating over the sides of the frame body 14 to its underside and there in turn connected to the electrically conductive material layer 19. The material layer in turn is connected to a control unit by the connection with the contact panel 25 and the feed line 26. As a result, a planar sensor element is achieved as the upper side 15 against the underside 29 of the operating panel 28. The latter operates in the usual way by detection of the placing of an operator's finger above the sensor element device 11 or the upper side 15.

It is therefore possible with the invention to keep the illuminated display 13 with the sensor element as the upper side 15 pressed against the underside 29 of the operating panel 28 thanks to the springy or elastic yielding properties of the material layer 19. In this way, both possible movements and height tolerances or assembly tolerances can be equalized. There is always a defined contact of the upper side 15 to the underside 29. Furthermore, it is possible due to the electrically conductive coating and to the electrically conductive material layer 19 to achieve a connection to the sensor element as the upper side 15.

An alternative design of the sensor element device 11 is shown in FIG. 4, where no electrically conductive coating of the illuminated display 113 is provided, and the frame body 114 comprises electrically conductive plastic. It also does not have to be designed translucent or specifically non-translucent. It encloses a light guide body 116, which does not however have to be electrically conductive. An upper side 115 of the frame body 114 is sufficient as a surrounding area for again forming a capacitive sensor element.

The illuminated display 113 rests with an underside of the frame body 114 on an upper side of a material layer 119. The latter is in turn designed in accordance with the previous figures, i.e., electrically conductive and elastic. However, the frame body 114 has here a ring-like flange 117 projecting at the underside for improving the bond between the two parts and engaging from above into a central recess 120 of the material layer 119. In this way precise centering or assignment is determined. Furthermore, a certain holding effect is achieved. It may thus be possible to dispense with gluing of the two parts, this being regarded as advantageous both for mechanical holding and for an electrically conductive connection using conductive adhesive.

Furthermore, FIG. 4 also shows an LED 131 as the illuminant, extending into the central recess 120 and radiating from underneath into the light guide body 116 and out at the top with its symbol form or any required form. An LED of this type can also be provided in the operating device 22 in accordance with FIG. 3 in the center of the contact panel 25 and electrical LED connections can be connected by through-contacts inside the surface of the contact panel 25.

An advantage during processing and manufacture of the operating device is therefore that the illuminated display together with the material layer of the stated plastic can be made beforehand as one structural unit or sensor element device. This means that component fitting is very easy. For example, an adhesive tape ensuring electrical conductivity is provided on the underside of the material layer after connection of the two parts to form one structural unit. This structural unit can thus be fitted with an automatic surface mounted device ("SMD") machine onto component carriers or PCBs. Furthermore, a higher component density can be achieved in this way, since compared with solutions known from EP 1 030 536 A1, for example, no sensor element devices are necessary which are larger at the side than the illuminated display itself.

The invention claimed is:

1. A sensor element device for a capacitive proximity switch of an operating device with an operating panel, said sensor element device having an upper side for contacting an underside of said operating panel, said sensor element device comprising:
    an illuminated display comprising a sensor element, said illuminated display having a top side facing said underside of said operating panel, said illuminated display comprising a frame body with a lighting direction towards said underside of said operating panel, wherein said illuminated display is electrically conductive at least on said top side facing said underside; and
    a material layer comprising an elastic, electrically conductive material having a first side and a second side, wherein said illuminated display is attached to said first side of said material layer and said second side of said material layer is attached to a component carrier,
    wherein said illuminated display has an electrically conductive connection from said upper side to said underside for establishing contact to said material layer, and wherein said illuminated display is further connected via said material layer to an electrical port of a control unit,
    the sensor element is made up from the topside of the frame body, wherein the frame body is electrically conducting, wherein the sensor element as part of the frame body is in contact with said underside of said operating panel, wherein the frame body is placed upon the first side of said material layer, said material layer comprising the elastic, electrically conductive material,
    wherein said illuminated display and said frame body are designed in a block-like manner,
    wherein said frame body and said illuminated display form a function unit,
    wherein said electrically conductive connection is a conductive lacquer provided on said top side of said illuminated display at least in an area of contact by one part of said sensor element with said underside of said operating panel and extending from a rim of said illuminated display to a lower area or to an underside and to said material layer,
wherein said conductive lacquer is translucent, and
wherein the frame body and the illuminated display form a structural unit.

2. The sensor element device according to claim 1, wherein said sensor element of said illuminated display is designed in a surrounding, frame-like manner.

3. The sensor element device according to claim 1, wherein said sensor element is coincident with said top side of said illuminated display.

4. The sensor element device according to claim 1, wherein said sensor element has a recess approximately of a size of a display symbol of said illuminated display.

5. The sensor element device according to claim 1, wherein said sensor element is in planar contact with said underside of said operating panel.

6. The sensor element device according to claim 1 wherein the said conductive lacquer covers substantially said entire top side of said illuminated display.

7. A sensor element device for a capacitive proximity switch of an operating device with an operating panel, said sensor element device having an upper side for contacting an underside of said operating panel, said sensor element device comprising:
an illuminated display comprising a sensor element, said illuminated display having a top side facing said underside of said operating panel, said illuminated display comprising a frame body with a lighting direction towards said underside of said operating panel, wherein said illuminated display is electrically conductive at least on said top side facing said underside; and
a material layer comprising an elastic, electrically conductive material having a first side and a second side, wherein said illuminated display is attached to said first side of said material layer and said second side of said material layer is attached to a component carrier,
wherein said illuminated display has an electrically conductive connection from said upper side to said underside for establishing contact to said material layer, and wherein said illuminated display is further connected via said material layer to an electrical port of a control unit,
the sensor element is made up from the topside of the frame body, wherein the frame body is electrically conducting, wherein the sensor element as part of the frame body is in contact with said underside of said operating panel, wherein the frame body is placed upon the first side of said material layer, said material layer comprising the elastic, electrically conductive material,
wherein said illuminated display and said frame body are designed in a block-like manner,
wherein said frame body and said illuminated display form a function unit,
wherein said electrically conductive connection is a conductive lacquer provided on said top side of said illuminated display at least in an area of contact by one part of said sensor element with said underside of said operating panel and extending from a rim of said illuminated display to a lower area or to an underside and to said material layer,
wherein said conductive lacquer is opaque, and
wherein the frame body and the illuminated display form a structural unit.

8. The sensor element device according to claim 1 wherein said conductive lacquer covers a surrounding frame-like area of said illuminated display.

9. The sensor element device according to claim 1, wherein said illuminated display comprises an electrically conductive material forming both said sensor element on said top side of said illuminated display and said electrically conductive connection on said material layer.

10. A sensor element device for a capacitive proximity switch of an operating device with an operating panel, said sensor element device having an upper side for contacting an underside of said operating panel, said sensor element device comprising:
an illuminated display comprising a sensor element, said illuminated display having a top side facing said underside of said operating panel, said illuminated display comprising a frame body with a lighting direction towards said underside of said operating panel, wherein said illuminated display is electrically conductive at least on said top side facing said underside; and
a material layer comprising an elastic, electrically conductive material having a first side and a second side, wherein said illuminated display is attached to said first side of said material layer and said second side of said material layer is attached to a component carrier,
wherein said illuminated display has an electrically conductive connection from said upper side to said underside for establishing contact to said material layer, and wherein said illuminated display is further connected via said material layer to an electrical port of a control unit,
the sensor element is made up from the topside of the frame body, wherein the frame body is electrically conducting, wherein the sensor element as part of the frame body is in contact with said underside of said operating panel, wherein the frame body is placed upon the first side of said material layer, said material layer comprising the elastic, electrically conductive material,
wherein said illuminated display and said frame body are designed in a block-like manner,
wherein said frame body and said illuminated display form a function unit,
wherein said illuminated display comprises an electrically conductive material forming both said sensor element on said top side of said illuminated display and said electrically conductive connection on said material layer,
wherein said electrically conductive material layer is electrically conductive plastic, and
wherein the frame body and the illuminated display form a structural unit.

11. The sensor element device according to claim 1, wherein said illuminated display comprises a seven-segment display with a frame body and light guide bodies of translucent material or light passageways.

12. The sensor element device according to claim 1, wherein said illuminated display is fastened to said material layer by an electrically conductive bond.

13. The sensor element device according to claim 1, wherein said material layer comprises electrically conductive, flexible foam.

14. The sensor element device according to claim 1, wherein said material layer has a cutout for arrangement of an illuminant therein for said illuminated display.

15. The sensor element device according to claim 14, wherein said cutout is located centrally and said material layer is designed as an surrounding frame and in particular opaque to a lateral side.

* * * * *